United States Patent
Shibata et al.

(10) Patent No.: US 6,392,255 B1
(45) Date of Patent: May 21, 2002

(54) DISPLAY DEVICE HAVING A THIN FILM TRANSISTOR AND ELECTRONIC DEVICE HAVING SUCH DISPLAY DEVICE

(75) Inventors: Hiroshi Shibata; Atsuo Isobe, both of Kanagawa (JP)

(73) Assignee: Semiconductor Energy Laboratory Co., LTD, Kanagawa-ken (JP)

( * ) Notice: Subject to any disclaimer, the term of this patent is extended or adjusted under 35 U.S.C. 154(b) by 0 days.

(21) Appl. No.: 09/671,780

(22) Filed: Sep. 27, 2000

(30) Foreign Application Priority Data

Sep. 27, 1999 (JP) ............................................. 11-272583

(51) Int. Cl.$^7$ ........................ H01L 27/108; H01L 29/76; H01L 29/94; H01L 31/119; H01L 27/01
(52) U.S. Cl. .............................. 257/59; 257/59; 257/72; 257/350
(58) Field of Search ............................ 257/59, 72, 296, 257/350

(56) References Cited

U.S. PATENT DOCUMENTS

| 5,650,636 | A | 7/1997 | Takemura et al. |
| 5,712,495 | A | 1/1998 | Suzawa |
| 5,856,689 | A | 1/1999 | Suzawa |
| 5,998,841 | A | 12/1999 | Suzawa |
| 6,323,515 | B1 * | 11/2001 | Yamazaki et al. .......... 257/316 |

OTHER PUBLICATIONS

U.S. application No. 09/653,535, Hiroshi Shibata et al., filed Aug. 31, 2000. Semiconductor Devie And Method Of Manufacturing Thereof.

* cited by examiner

Primary Examiner—Ngân V. Ngô
(74) Attorney, Agent, or Firm—Eric J. Robinson; Nixon Peabody LLP

(57) ABSTRACT

To provide a liquid crystal display device having high quality display with a high aperture ratio while securing a sufficient storage capacitor (Cs), and at the same time, by dispersing a load (a pixel writing-in electric current) of a capacitor wiring in a timely manner to effectively reduce the load. A scanning line is formed on a layer that is different from a gate electrode so that the capacitor wiring is arranged in parallel with a signal line. Each pixel is connected to the individually independent capacitor wiring via a dielectric. Therefore, variations in the electric potential of the capacitor wiring caused by a writing-in electric current of adjacent pixels can be avoided, thereby obtaining satisfactory display images.

24 Claims, 10 Drawing Sheets

A-A' cross section

B-B' cross section

C–C' crossection

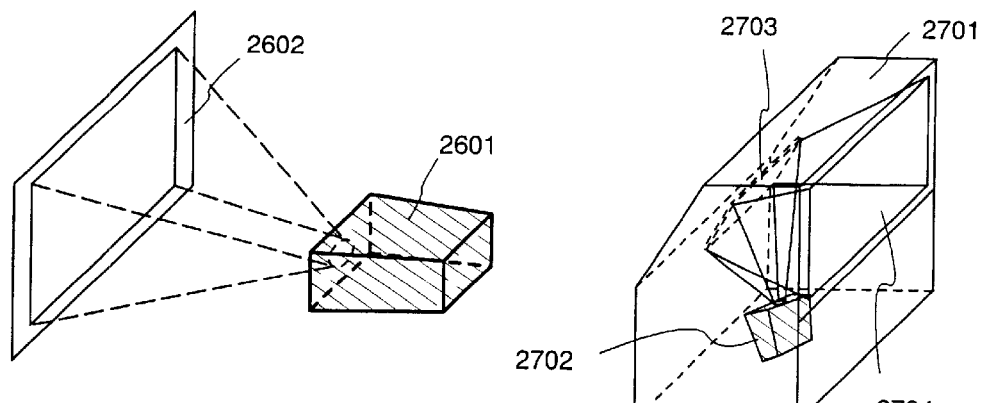
Fig. 8A
Fig. 8B
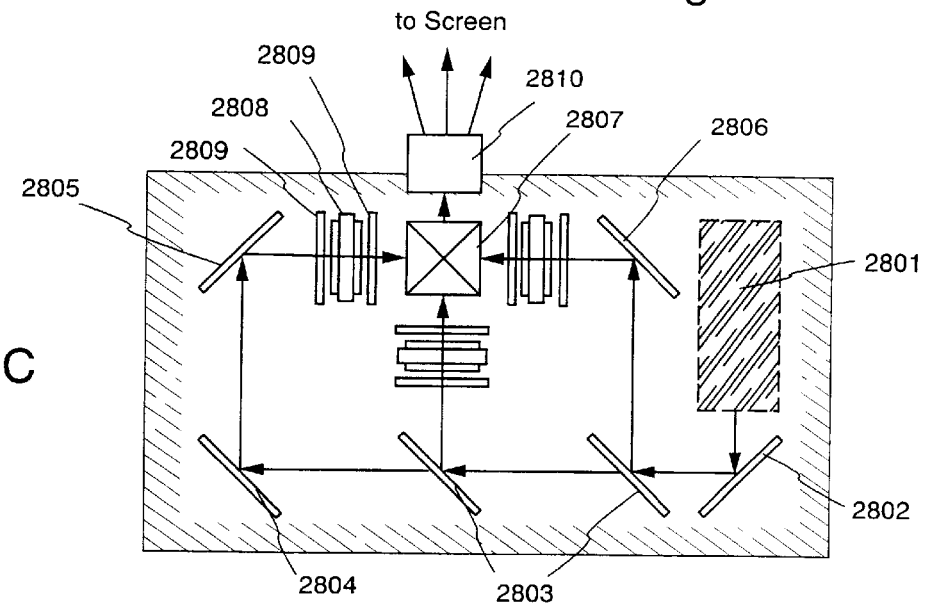
Fig. 8C
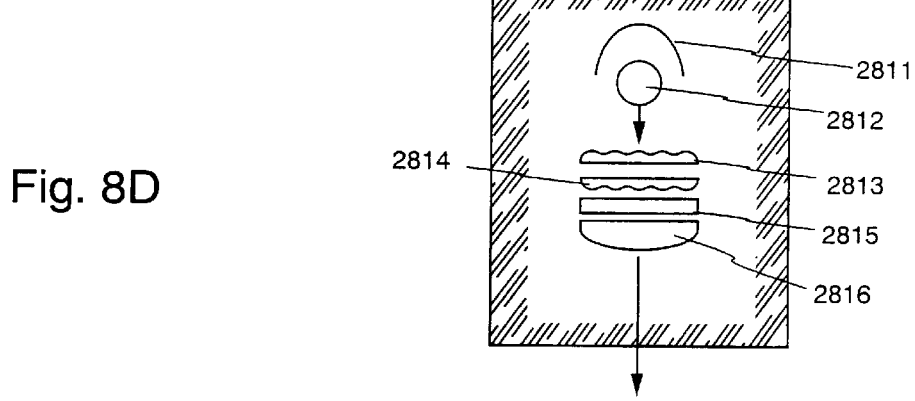
Fig. 8D

10: Semiconductor film
12: signal line
13: electrode
11: scan line
14: capacitor line

DISPLAY DEVICE HAVING A THIN FILM TRANSISTOR AND ELECTRONIC DEVICE HAVING SUCH DISPLAY DEVICE

BACKGROUND OF THE INVENTION

1. Field of the Invention

The present invention relates to a semiconductor device having a circuit constructed of a thin film transistor (hereinafter referred to as TFTs) and a method of manufacturing the same. For example, the present invention relates to an electro-optical device typified by a liquid crystal display panel, and electronic equipment having such an electro-optical device mounted thereon as a part.

Note that a semiconductor device as used herein throughout the present specification indicates a general device that functions by utilizing semiconductor characteristics, and that electro-optical devices, semiconductor circuits, and electronic equipments are all semiconductor devices.

2. Description of the Related Art

Techniques for structuring a thin film transistor (TFT) using a semiconductor thin film (having a thickness on the order of about several to several hundred nm) formed on a substrate having an insulating surface have been in the spotlight in recent years. Thin film transistors are widely applied to electronic devices such as an IC or an electro-optical device, and in particular, development of the TFT as a switching element of a liquid crystal display device is proceeding rapidly.

In order to obtain high quality images in the liquid crystal display device, an active matrix liquid crystal display device that utilizes TFTs as switching elements to be connected to respective pixel electrodes, which are arranged in matrix, is attracting much attention.

To perform good quality display in the active matrix liquid crystal display device, it is necessary that the electric potential of an image signal is held in each pixel electrode connected to the TFTs until the next write-in time. Generally, the provision of a storage capacitor (Cs) in each pixel holds the electric potential of the image signal.

Various proposals have been made for the structure and the formation methods of the above-stated storage capacitor (Cs). However, from the viewpoint of reliability or simplicity of the manufacturing process, it is preferable that a gate insulating film of a TFT, among the insulating films for structuring a pixel, be utilized as a dielectric of the storage capacitor (Cs) because it is an insulating film of the highest quality. Conventionally, as shown in FIG. 9, a capacitor wiring that becomes an upper electrode is first formed by utilizing a scanning line, and then the formation of the storage capacitor (Cs) is carried out by using the upper electrode (capacitor wiring), a dielectric layer (gate insulating film), and a lower electrode (semiconductor film).

Also, from the perspective of display performances, there is a demand to provide pixels with larger storage capacitors as well as to make the aperture ratio of the pixels higher. Efficient utilization of a backlight is improved if each pixel has a high aperture ratio. Consequently, the amount of backlight for obtaining a predetermined display luminance can be restrained, and therefore power-saving and small-scale display device can be achieved. Furthermore, by providing each pixel with a large storage capacitor, the characteristic of each pixel in holding display data is improved, thereby improving display quality. In addition, for the case of point sequential driving of the display device, a signal storage capacitor (sample hold capacitor) is required in the driver circuit side of each signal line. However, with the provision of a large storage capacitor in each pixel, a surface area occupied by the sample hold capacitor can be made smaller, and therefore the display device can be made smaller.

Such demands become problems in proceeding with the progress of making the pitch of each display pixel microscopic which accompanies the progress of making a liquid crystal display device smaller and higher in definition (increasing the number of pixels).

There is an additional problem in that it is difficult to make a high aperture ratio and a large storage capacitor compatible with each other in the above-stated conventional pixel structure.

An example in which a conventional pixel structure having the size of a pixel formed to 19.2 μm in accordance with the design rule of Table 1 is shown in FIG. 9.

Table 1

Si layer: min. Size=0.8 μm, min. Spacing=1.5 μm Gate Electrode: min. Size=1.0 μm, min. Spacing=1.5 μm Scanning line: min. Size=1.5 μm, min. Spacing=1.5 μm Contact hole between signal line and Si layer: min. Size=1 μm☐ Margin between contact hole and Si layer: 1.0 μm Distance between contact hole and scanning line (gate electrode) min. Spacing=1.3 μm Signal line: min. Size=1.5 μm, min. Spacing=1.5 μm Margin between contact hole and signal line 1.3 μm Pixel size: 19.24 μm☐ Pixel TFT: L=1.5 μm, W=0.8 μm, single gate Scanning line: wiring width min. Size=1.0 μm Scanning line: wiring width at an Si layer overlapping portion min. Size=1.5 μm Capacitor wiring: min. Size=2.0 μm A characteristic of the conventional pixel structure is such that two wirings (a scanning line and a capacitor wiring) are arranged in parallel with each other for continuously forming two each of wirings, the scanning line and the capacitor wiring. In FIG. 9, reference numeral 10 denotes a semiconductor film, 11 denotes a scanning line, 12 denotes a signal line, 13 denotes an electrode, and 14 denotes a capacitor wiring. Note that FIG. 9 is a simplified top view of the pixel, and therefore a pixel electrode that is connected to the electrode 13 and a contact hole that reaches the electrode 13 are both not shown in the figure.

Thus, in the case of structuring the storage capacitor with an upper electrode (capacitor wiring), a dielectric layer (gate insulating film), and a lower electrode (semiconductor film), all the circuit elements (a pixel TFT, a storage capacitor, a contact hole, etc.) necessary for structuring a circuit of the pixel become elements relevant to a gate insulating film. Accordingly, these elements are arranged substantially planarly within each pixel.

Therefore, it is crucial to efficiently layout the circuit elements that are necessary for constructing the circuit of the pixel in order to attain both a high aperture ratio and a large storage capacitor of each pixel within the regulated pixel size. In other words, from the fact that all the circuit elements are in connection with the gate insulating film, it can be said that it is essential to improve the efficiency of utilizing the gate insulating film.

Thus, from the above perspective, an efficient planar layout of the example of the circuit structure of a pixel of FIG. 9 is shown in FIG. 10. In FIG. 10, reference numeral 21 denotes a single pixel region, 22 denotes a pixel opening region, 23 denotes a storage capacitor region, 24 denotes an A region, and 25 denotes a portion of the TFT and a contact region.

With respect to the area of the pixel opening region 22 which is 216.7 μm² (aperture ratio of 58.8%) as shown in FIG. 10, it is composed of the areas of the storage capacitor region 23 which is 64.2 $\mu m^2$, the portion of the TFT and the contact region 25 which is 42.2 $\mu m^2$ and the A region 24 which is 34.1 $\mu m^2$.

The A region 24 is a separation region between the scanning line and the capacitor wiring which is necessary from the fact that a wiring portion for mutually connecting a region that functions as a gate electrode of a TFT, the scanning line and the capacitor wiring are arranged parallel to each other. The gate insulating film of the A region is not rendered its original function, becoming the cause of reducing the efficiency of layout.

Further, in the case of the above structure, there is a problem in that the demand for a capacitor wiring resistance has become strict.

In a normal liquid crystal display device drive, the writing-in of the electric potential of the image signal to the plurality of pixels connected to each scanning line is performed consecutively in the scanning line direction (in the case of the point sequential drive) or all at the same time (in the case of the linear sequential drive).

In terms of arranging the capacitor wiring and the scanning line in parallel with each other in the pixel structure as stated above, the plurality of pixels connected to the respective scanning lines are connected to a common capacitor wiring. Therefore, opposing electric currents for a plurality of pixels corresponding to the pixel writing-in electric current continuously or simultaneously flow in the common capacitor wiring. In order to avoid a reduction in display quality caused by the electric potential fluctuation of the capacitor wiring, it is necessary to sufficiently lower the capacitor wiring resistance.

However, widening the width of the wiring for lowering the is resistance of the capacitor wiring means that the surface area of the storage capacitor is enlarged while the aperture ratio of the pixel is reduced.

SUMMARY OF THE INVENTION

The present invention has been made in view of the above problems as a solution for the designing side, and therefore has an object thereof to provide a display device such as a liquid crystal display device having high quality display with a high aperture ratio while securing a sufficient storage capacitor (Cs), and at the same time, by dispersing a load (a pixel writing-in electric current) of the capacitor wiring in a timely manner to effectively reduce the load.

According to one aspect of the present invention disclosed in the specification, there is provided a semiconductor device comprising:

a semiconductor film formed on an insulating surface;

a first insulating film (a gate insulating film) formed on the semiconductor film;

a gate electrode and a first wiring (a capacitor wiring) formed on the first insulating film;

a second insulating film formed on the gate electrode and the first wiring;

a second wiring (a scanning line) to be connected to the gate electrode, formed on the second insulating film; and a third insulating film formed on the second wiring, wherein the semiconductor device is characterized in that the first wiring and the second wiring overlap via the second insulating film, and a storage capacitor is formed with the second insulating film as a dielectric in the region where the first wiring and the second wiring overlap via the second insulating film.

According to another structure of the present invention, there is provided a semiconductor device comprising:

a semiconductor film formed on an insulating surface;

a first insulating film (a gate insulating film) formed on the semiconductor film;

a gate electrode and a first wiring (a capacitor wiring) formed on the first insulating film;

a second insulating film formed on the gate electrode and the first wiring;

a second wiring (a scanning line) to be connected to the gate electrode, formed on the second insulating film; and a third insulating film formed on the second wiring, wherein the semiconductor device is characterized in that the first wiring and the semiconductor film overlap via the first insulating film, and a storage capacitor having the first insulating film as a dielectric is formed in the region where the first wiring and the semiconductor film overlap via the first insulating film.

Also, in the above-mentioned structure of the present invention, the semiconductor device is characterized in that the first wiring and the second wiring overlap via the second insulating film, and a storage capacitor is formed with the second insulating film as a dielectric in the region where the first wiring and the second wiring overlap via the second insulating film.

Further, in the above-mentioned respective structures of the present invention, the semiconductor device is characterized in that, in the semiconductor film, an impurity element that imparts a p-type or n-type conductivity is doped into the region that overlaps the first wiring via the first insulating film.

Further, in the above-mentioned respective structures of the present invention, the semiconductor device is characterized in that the first wiring and the second wiring are arranged in a direction intersecting with each other.

Further, in the above-mentioned respective structures of the present invention, the semiconductor device is characterized in that a third wiring (a signal line) to be connected to the semiconductor film is provided on the third insulating film, and that in the semiconductor film, the region that is to be connected to the third wiring is a source region or a drain region.

Further, in the above-mentioned respective structures of the present invention, the semiconductor device is characterized in that a pixel electrode to be electrically connected to the semiconductor film is provided.

Further, in the above-mentioned respective structures of the present invention, the semiconductor device is characterized in that the first wiring is arranged in a direction parallel to the third wiring.

Further, in the above-mentioned respective structures of the present invention, the semiconductor device is characterized in that the gate electrode is formed on a different layer from the scanning line.

Further, in the above-mentioned respective structures of the present invention, the semiconductor device is characterized in that the gate electrode is patterned into an island shape.

Further, an aspect of the present invention to attain the above structures, of the semiconductor device is a method of manufacturing a semiconductor device, characterized by comprising the steps of:

forming an island shape semiconductor film on a substrate;

forming a first insulating film (a gate insulating film) on the island shape semiconductor film;

forming an island shape gate electrode and capacitor wiring;

forming a second insulating film covering the gate electrode and the capacitor wiring;

forming a first contact hole to reach the gate electrode by selectively etching-the second insulating film;

forming a scanning line to be connected to the gate electrode on the second insulating film;

forming a third insulating film on the scanning line;

forming a second contact hole to reach the semiconductor film by selectively etching the third insulating film; and forming a signal line to be electrically connected to the semiconductor film.

In the above-mentioned manufacturing method of the present invention, it is preferable that the second insulating film that overlaps the scanning line is partially thinned after the formation of the first insulating film on the semiconductor film.

Further, it is another aspect of the invention that the wirings for forming storage capacitances extend in a direction parallel with the data signal lines and in a direction perpendicular to the gate (scanning) lines. This feature is advantageous in that the influence caused by the variation of the potential of the scanning lines can be suppressed.

BRIEF DESCRIPTION OF THE DRAWINGS

In the accompanying drawings:

FIGS. 8A to 8D are diagrams showing examples of electronic equipment;

DETAILED DESCRIPTION OF THE PREFERRED EMBODIMENTS

Hereinafter, preferred embodiments of the present invention will be described.

The present invention is characterized in that a scanning line is formed on a different layer from a gate electrode and that a storage capacitor is formed with the scanning line as an upper electrode in order to increase an aperture ratio as well as to increase a storage capacitor.

In accordance with the preferred embodiment of the invention, a gate electrode formed into an island shape by patterning is connected to a scanning line, which is formed on a second insulating film, through a contact hole formed in the second insulating film.

In the present invention, a storage capacitor is comprised of a semiconductor film as a lower electrode, a first insulating film (a gate insulating) as a dielectric, and a capacitor wiring as an upper electrode. Similar to a source region or a drain region, it is preferable that a region that overlaps a capacitor wiring via the first insulating film be made low resistant. In addition, the storage capacitor may be enlarged by partially thinning a portion of the first insulating film that comes in contact with the capacitor wiring and overlaps thereon.

Figure 1:
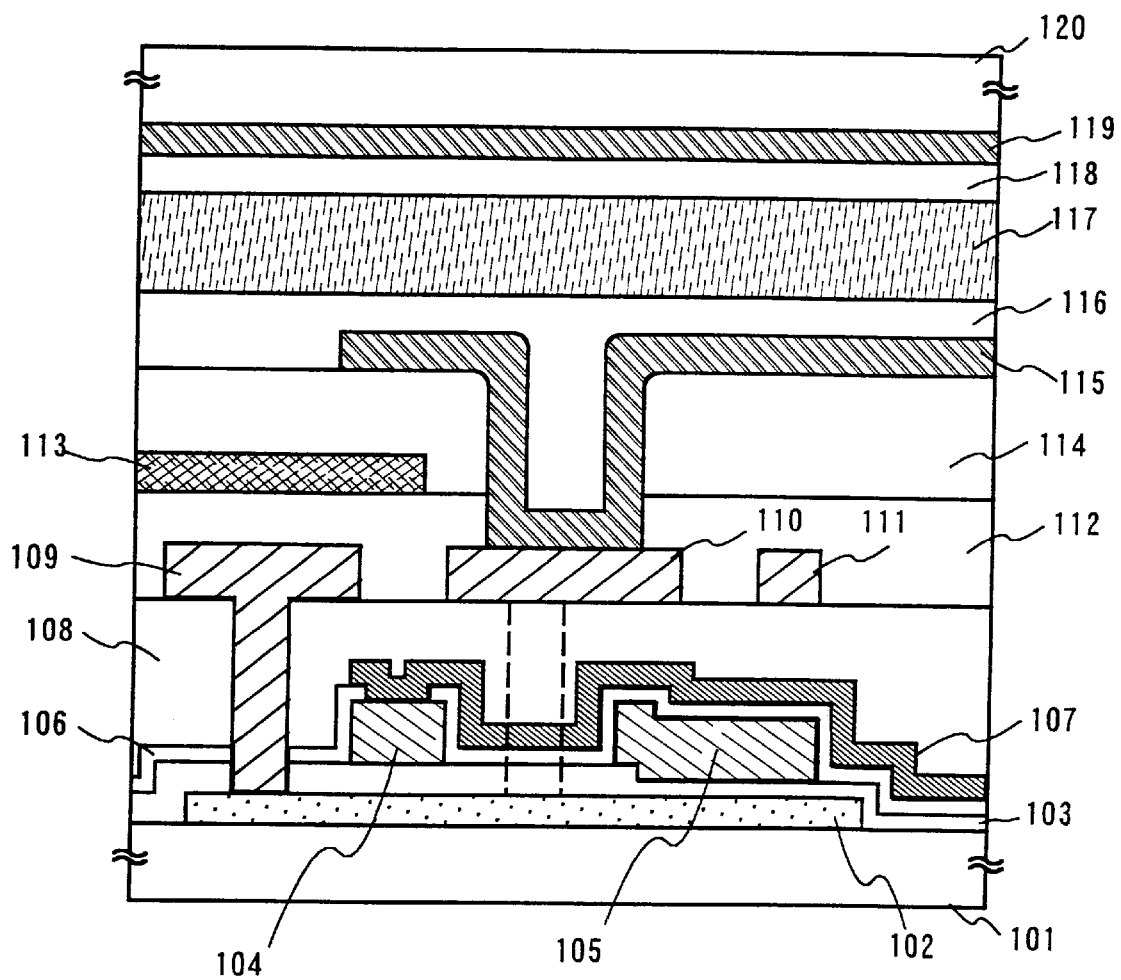
FIG. 1 is a diagram illustrating the cross-sectional structure of an active matrix liquid crystal display device.

Further, according to the present invention, as shown in FIG. 1, a scanning line 107 is formed in an upper layer over a gate electrode 104, thereby forming a capacitor with a second insulating 106, which comes in contact with the gate electrode, as a dielectric. This capacitor is composed of a capacitor wiring 105 as the lower electrode, the second insulating film 106 as the dielectric, and the scanning line 107 as the upper electrode.

Figure 3A:
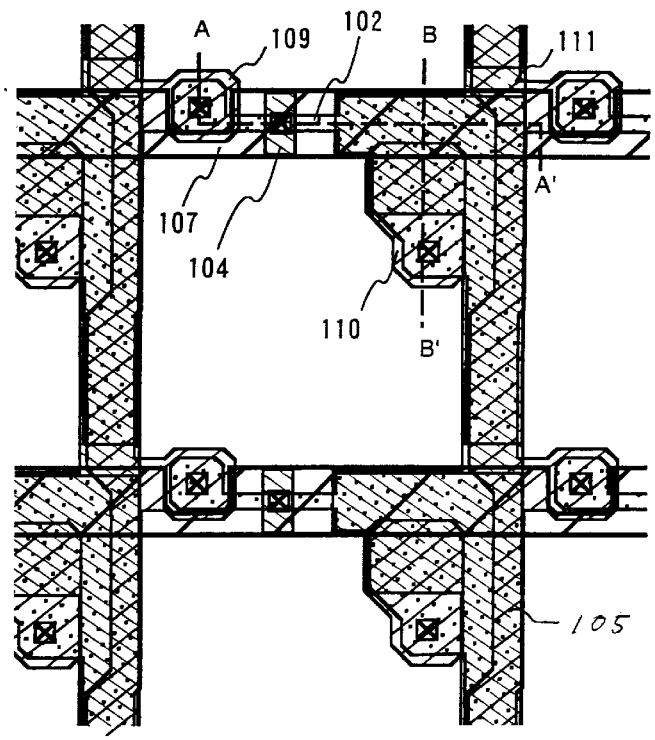
FIGS. 3A and 3B are diagrams showing a top view of a pixel and pixel opening region, respectively.

The present invention is unlike the prior art (in which the capacitor wiring is arranged in parallel with the scanning line) in that the capacitor wiring 105 is arranged so that it is parallel with signal lines 109 and 111 as shown in FIG. 3A. Accordingly, good image display can be obtained since fluctuations in the electric potential of the capacitor wiring due to a writing-in current of a neighboring pixel are avoided because each pixel is connected to each independent capacitor wiring even if consecutive writing-in of the image signals is performed to the pixels corresponding to each scanning line under the driving method.

In addition, the performance demanded for the capacitor wiring resistance has been alleviated because of the same reasons as the above, and therefore there is more degree of freedom in designing the arrangement, size, and film thickness of the capacitance wiring. Furthermore, because the selection range of the materials for the capacitor wiring has widened, the degree of complication in designing and manufacturing has lessened, leading to the attainment of a higher production yield.

Regarding the present invention composed of the above aspects, a detailed description will be made of the embodiments shown in the following.

Embodiment 1

Hereinafter, embodiments of the present invention will be described taking a point sequential drive of a projector type liquid crystal display device as an example.

An active matrix type liquid crystal display device utilizing a TFT as its switching element is constructed of a substrate (TFT substrate) with pixel electrodes arranged in matrix and an opposing substrate with opposing electrodes formed thereon arranged facing the TFT substrate via a liquid crystal layer. The space between the two substrates is controlled at a predetermined interval via spacers, etc. and a sealing material is used around the outer periphery portion of the display region to enclose the liquid crystal layer.

FIG. 1 is a view schematically showing a cross-sectional structure of the liquid crystal display device of the present embodiment. In FIG. 1, reference numeral 101 denotes a substrate (TFT substrate), 102 denotes a semiconductor film, 103 denotes a gate insulating film (a first insulating film), 104 denotes the gate electrode, 105 denotes a capacitor wiring, 106 a second insulating film, 107 denotes the scanning lines, 108 denotes a third insulating film, and 109 and 111 denote signal lines or electrodes diverged from the signal lines. Reference numeral 110 denotes an electrode, which is connected to the pixel electrode.

It is to be noted that throughout the present specification, the term electrode is part of the wiring and it indicates the places where it electrically connects with other wirings and the places where it intersects with the semiconductor layer. Thus, although the terms wiring and electrode are used for the sake of explanation conveniences, the term wiring is always included in the meaning of electrode.

Note that portions denoted by the reference numerals 102 to 110 are defined as TFTs (switching element) throughout the present specification. In addition, reference numerals 109 and 110 may be an electrode diverged from a wiring or a wiring.

Furthermore, reference numeral 112 denotes a fourth insulating film which covers the TFTs, 113 denotes a light shielding film for preventing the TFTs from light deterioration, 114 denotes a fifth insulating film, 115 denotes a pixel electrode connected to the pixel electrode, and 116 denotes an orientation film for orientating a liquid crystal layer 117.

Also in FIG. 1, an opposing electrode 119 and an orientation film 118 are provided on an opposing substrate 120, and besides, a light shielding film and a color filter may be provided when necessary. Although not shown in the drawings, it is advantageous to manufacture thin film transistors of driver circuits simultaneously as thin film transistors of pixels.

Figure 2:
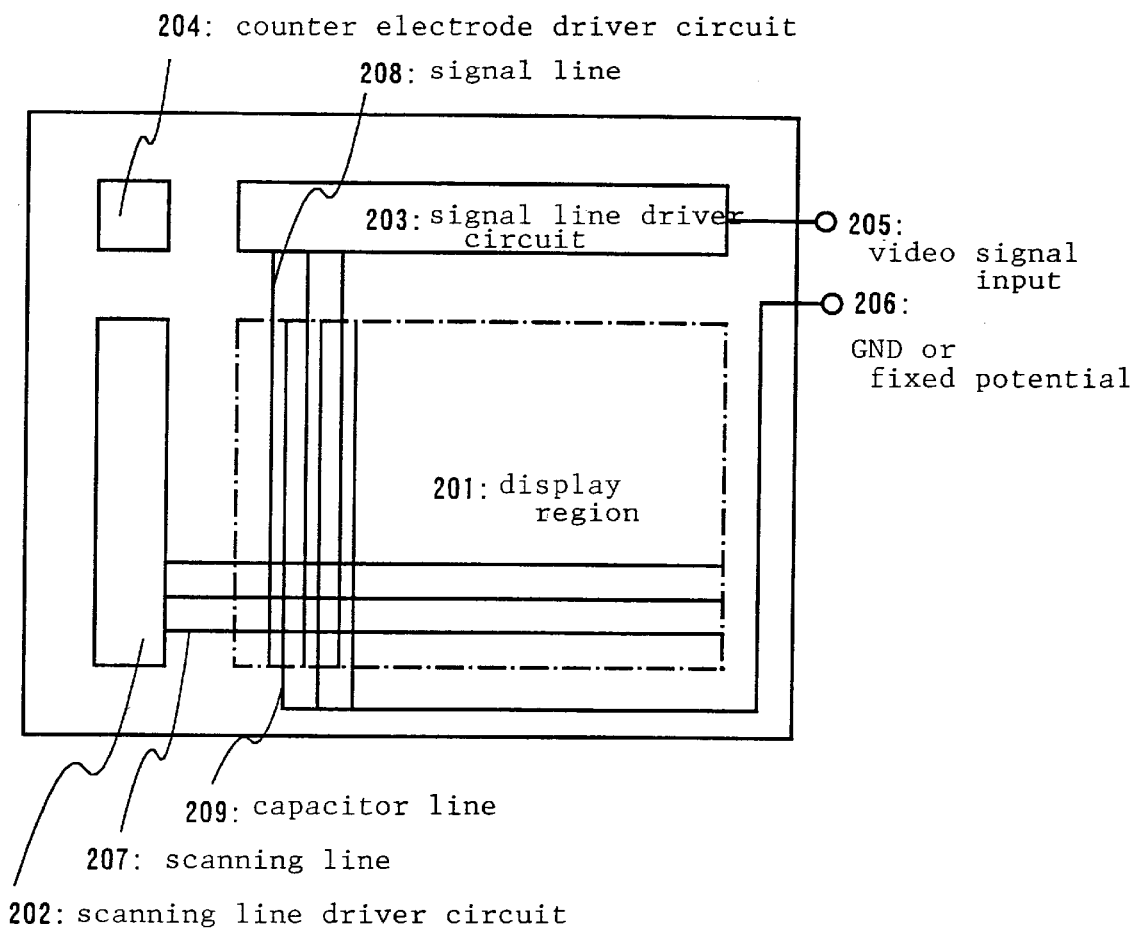
FIG. 2 is a diagram showing a circuit structure of a TFT substrate.

The substrate (TFT substrate) 101 comprises a display region 201, and a scanning line driver circuit 202 and a signal line driver circuit 203 formed in the periphery thereof as shown in FIG. 2.

The scanning line driver circuit 202 is mainly composed of shift registers for sequentially transmitting scanning signals. The signal line driver circuit 203 is mainly composed of sample hold circuits for holding an image signal and driving a signal line after sampling a shift register and the image signal that is inputted on the basis of an output of the shift register.

In the display region 201, a plurality of scanning lines (gate wirings) 207 connected to the scanning line driver circuit 202 and arranged parallel to each other at a predetermined interval and a plurality of signal lines 208 connected to the signal line driver circuit 203 and arranged parallel to each other at a predetermined interval. The scanning lines 207 and the signal lines 208 intersect each other. Together with arranging TFTs at each point of intersection, pixel electrodes are arranged in the respective regions marked off by the scanning lines and signal lines. Thus, each pixel electrode is arranged in matrix from this structure. In addition, a plurality of capacitor wirings 209 connected to a GND (ground) or a fixed electric potential is provided parallel to the signal lines 208. It is to be noted that for simplification, only a few lines of the signal lines, the scanning lines, and the capacitor wirings are shown in FIG. 2.

Figure 3B:
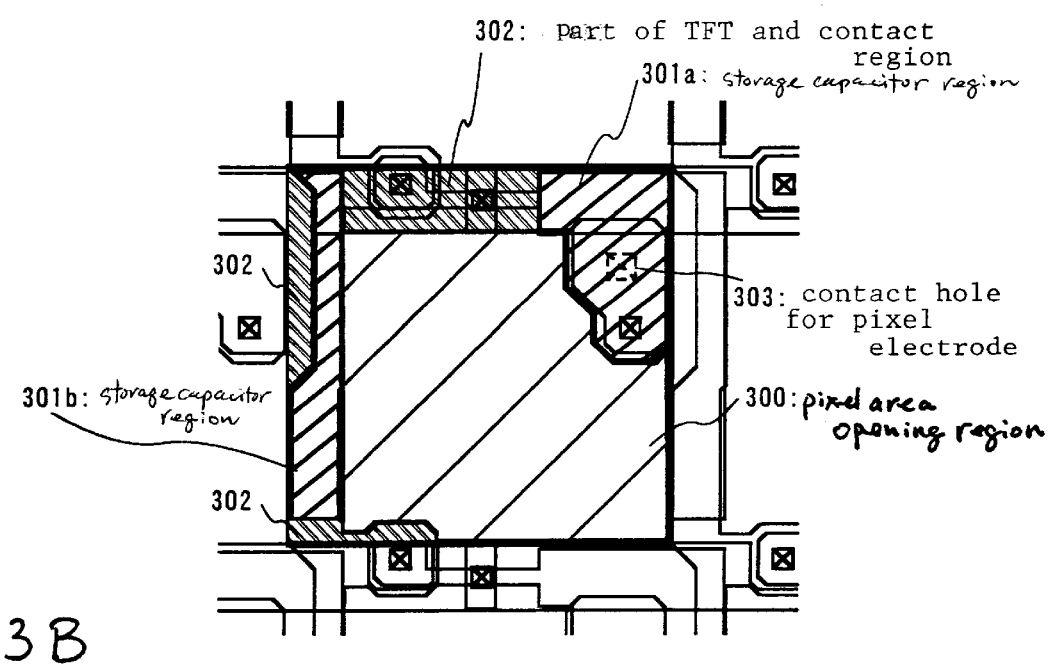

Hereinafter, a simplified process of manufacturing a semiconductor device shown in FIG. 1 is described with references to FIGS. 3A, and 3B and FIG. 4.

First, besides a glass substrate as the substrate 101, a quartz substrate and a plastic substrate can also be used. In the case of using a glass substrate, heat treatment may be performed in advance at a temperature that is approximately 10 to 20° C. lower than the distortion point of glass. Furthermore, a base film is formed on the surface of the substrate 101 on which the TFTs will be formed in order to prevent the diffusion of impurities from the substrate 101. The base film is made of an insulating film such as a silicon oxide film, a silicon nitride film, or a silicon nitride oxide film.

The semiconductor film 103 is formed next to a thickness of between 25 and 80 nm (preferably between 30 and 60 nm) by known methods such as plasma CVD or sputtering, and then patterned into a desired shape. In this embodiment, an amorphous silicon film is formed to about 50 nm thick by plasma CVD. With a known crystallization method, a crystallization process is performed to form a crystalline silicon film (poly-Si) from the amorphous silicon film. Then patterning is conducted on the crystalline silicon film to pattern it into an island shape. Although the present embodiment uses a crystalline silicon film (poly-Si), no particular limitations are placed as long as it is a semiconductor film.

Note that throughout the present specification, the term semiconductor film denotes a single crystal semiconductor film, a crystalline semiconductor film (such as poly-Si), an amorphous semiconductor film (such as a-Si), or a microcrystalline semiconductor film. Further, a compound semiconductor film such as a silicon germanium film is also included as the semiconductor film.

An insulating film containing silicon formed by methods such as plasma CVD or sputtering, or an oxide film formed of a semiconductor film (such as an Si film), which has been thermally oxidized, is used to form the first insulating film (gate insulating film) 103. The first insulating film 103 may be a laminate structure made up of a plurality of layers such as two layers or three layers when necessary.

A conductive film is formed next on the first insulating film 103. Then patterning is performed to form the gate electrode 104 and the capacitor wiring 105. The gate electrode 104 and the capacitor wiring 105 are formed at the thickness of about 300 nm with conductive materials such as poly-Si which have been doped with an impurity element that imparts a type of conductivity, $Wsi_X$ (X=2.0 to 2.8), Al, Ta, W, Cr, and Mo, and a laminated structure thereof. Further, a single layer maybe formed for the gate electrode 104 and the capacitor wiring 105, but a laminate structure made up of a plurality of layers such as two layers or three layers may also be formed when necessary.

Thereafter, in order to construct a TFT that functions as an image signal writing-in switch, with utilization of the respective island shape semiconductor films 104, a known technique is employed to selectively dope an impurity element (such as phosphorus or boron) that imparts a p-type or an n-type conductivity into the island shape semiconductor film 104, thereby forming a low resistance source region and drain region, and further forming a low resistance region. This low resistance region is similar to the drain region in that it is doped with an impurity element (typically phosphorus or boron) and is a part of the semiconductor films that have been made low resistance. Note that the order of the process of selectively doping the impurity element is not particularly limited. For example, the impurity element may be doped before the formation of the first insulating film and the gate electrode, or after the formation of the gate electrode. In addition, an LDD region or an offset region may be formed in response to the circuit structure. It is to be noted that the respective regions are not shown in the figure for simplification.

Thus, a channel forming region is formed between the source region and the drain region in the semiconductor film 104. The island shape gate electrode 104 is arranged on the channel forming region of each pixel through the first insulating film 102. Further, the capacitor wirings are arranged on the low resistance region. The capacitor wirings are also arranged continuously to each pixel in the signal line direction and electrically connected outside the display region to the ground or to the fixed electric potential. Note that the storage capacitor may be enlarged by adding a process in which the film of a region where the capacitor wirings overlap the first insulating film 102 is partially thinned.

The second insulating film 106 is formed next covering the gate electrode and the capacitor wirings. An insulating film containing silicon formed by methods such as plasma CVD or sputtering is used for the second insulating film 106. In addition, the second insulating film 106 may be formed of a silicon oxide film, a silicon nitride oxide film, a silicon nitride film, or a lamination film of a combination of these films.

Next, selective etching is performed on the second insulating film 106 to thereby form the first contact hole to reach the island shape gate electrode.

Next, a conductive film is formed on the second insulating film 106 and then patterning is performed to thereby form the scanning line 107. The scanning line 107 is connected to each island shape gate electrode through a first contact hole which is formed on the second insulating film 106 and arranged so that the periphery of a channel formation region are shield from the light. The scanning line 107 is formed using conductive materials film having light shielding characteristics such as $Wsi_x$, W, Cr, Al etc. or a laminated structure of $Wsi_x$/Poly-Si 100 nm thick. The scanning line 107 is connected to the scanning driver circuit.

The third insulating film 108 is formed next covering the scanning line. The third insulating film 108 may be formed of a film such as an organic insulating material film, a silicon oxide film, a silicon nitride oxide film or a silicon nitride film, or a lamination film of a combination of these films.

Next, a selective etching is performed on the first insulating film 103, the second insulating film 106 and the third insulating film 108 to thereby form the second contact hole to reach the semiconductor film (a source region or a drain region).

A film having Al, W, Ti, and TiN as its main component or a conductive film (film thickness: 500 $\mu$m) having a laminated structure of these elements is next formed on the third insulating film 108. Then patterning is performed, thereby forming the signal lines 109, 111 and the island shape electrode 110 for connection with a pixel electrode, which will be formed later. The signal lines 109 are connected to either the source region or the drain region through the second contact hole that reaches the semiconductor film. Similarly, the island shape electrode 110 is connected to either the source region or the drain region through the second contact hole that reaches the semiconductor film. Further, island shape electrode 110 is disposed isolated from signal lines 109 and 111. However, both the signal line 109 and the island shape electrode will not be connected to the source region together. Similarly, both the signal line 109 and the island shape electrode will not be connected to the drain region together.

Figure 4A:
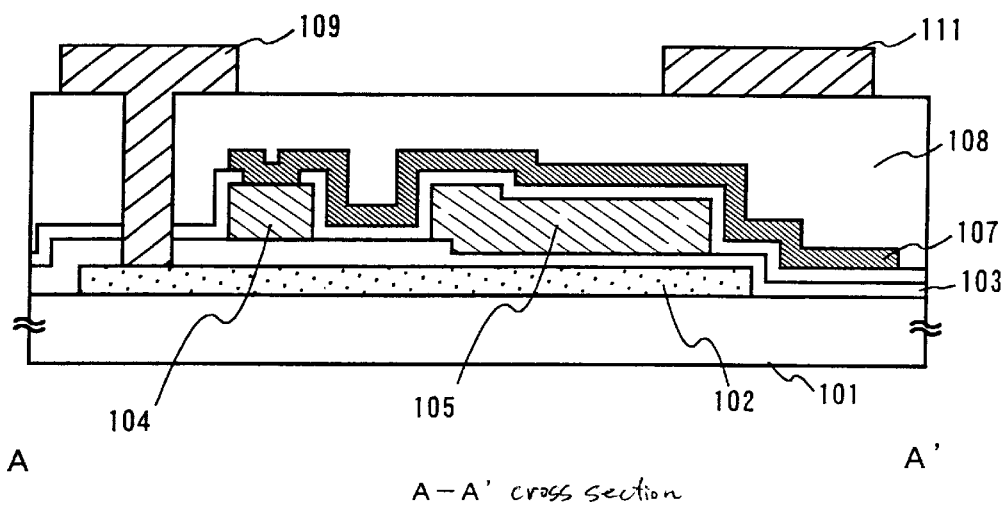
FIGS. 4A and 4B are diagrams showing cross-sectional views of the pixel.
Figure 4B:
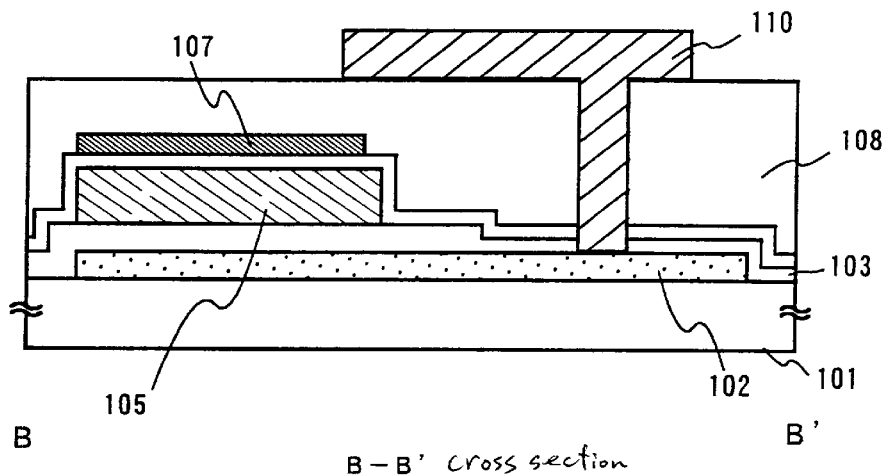

A top view of the pixel at this stage corresponds to FIG. 3A, and the schematic views of the cross-sectional structure in which the cross sections are taken along the broken line A—A' and the broken line B—B' in FIG. 3A correspond to FIGS. 4A and 4B respectively. The same portions in the respective figure are shown by same marks.

The fourth insulating film 112 is formed next covering the signal line and the island shape electrode. The fourth insulating film 112 may be formed of a film such as an organic insulating material film, a silicon oxide film, a silicon nitride oxide film or a silicon nitride film, or a lamination film of a combination of these films.

Subsequently, a film having light shielding characteristics formed of materials such as Ti, Al, W, Cr, or black-colored resin is formed on the fourth insulating film 112 and then patterned into a desired shape, thereby forming the light shielding film 113. The light shielding film 113 is arranged mesh like so that other areas, except the opening portion of the pixel, are shielded from light.

In Embodiment 1, although the light shielding film 113 becomes electrically floating, if a low resistance film is selected as the material for the light shielding film, then it is possible to control the light shielding film to an optional electric potential outside the display portion.

A fifth insulating film 114 is formed next on the light shielding film 113. It is appropriate to form the fifth insulating film 114 with a film made of an organic insulating material film. By forming the fifth insulating film 114 with an organic insulating material, the surface can be sufficiently flattened. In addition, parasitic capacitance can be reduced since organic resin materials are generally low in dielectric constant. However, because organic resin materials are absorbent with respect to moisture, they are not sufficient as protection films. Thus, the fifth insulating film 114 may be a laminate structure with combinations of a silicon oxide film, a silicon nitride oxide film, and a silicon nitride film.

Next, selective etching is performed on the fourth insulating film 112 and the fifth insulating film 114 to thereby form the third contact hole to reach island shape electrode 110.

A transparent conductive film such as an ITO film is formed next and then patterned to thereby form the pixel electrode 115. The pixel electrode 115 is connected to the island shape electrode 110 through the third contact hole. The respective pixel electrodes are each independently arranged so as to cover the opening portion of each pixel.

By employing the above described manufacturing steps, and furthermore arranging the wirings, the semiconductor film, and contact hole etc. in accordance with the design rules and pixel rules of Table 1, a surface area of 226.8 $\mu m^2$ of the pixel opening region (aperture ratio: 61.5%) and a surface area of 83.4 $\mu m^2$ of the storage capacitor region 301a and 301b can be obtained. In the FIG. 3B, the disposition of pixel electrode and third contact hole are shown.

A surface area of the TFT portion and the contact region 302 is much the same as that of a conventional example. A surface area (A region) which is conventionally used uselessly as a scanning /signal line separated region or TFT's gate connection wiring region is converted into the pixel opening portion and the storage capacitor portion in this constitution.

Thus utilizing efficiently the limited pixel portion makes it possible to be compatible high aperture ratio with wide storage capacitor area.

Accordingly good display image can be obtained since variations in the electric potential in the capacitor wiring due to writing-in current of a neighboring pixel are avoided because each pixel of is connected to storage capacitors formed of respective independent capacitor wiring even if consecutive writing-in of the image signal is performed to the pixels corresponding to each scanning line under the driving method.

In addition, the demand performance for the capacitor wiring resistance has been alleviated because of the same reasons as the above, and therefore there is more degree of freedom in designing the arrangement, size, and film thickness of the capacitance wiring. Furthermore, because the selection range of the materials for the capacitor wiring has widened, the degree of complication in designing and manufacturing has lessened, leading to the attainment of a higher production yield.

In embodiment 1, although a light shielding film is provided for convenience, manufacturing steps can be simplified as a structure without the light shielding film because the region except an opening portion of a pixel or a channel forming region of an island shape Si film, which needs to be shield from the light can be shielded from the light completely by the scanning line and the signal line by applying materials which have a high shielding effect.

Embodiment 2

Figure 5A:
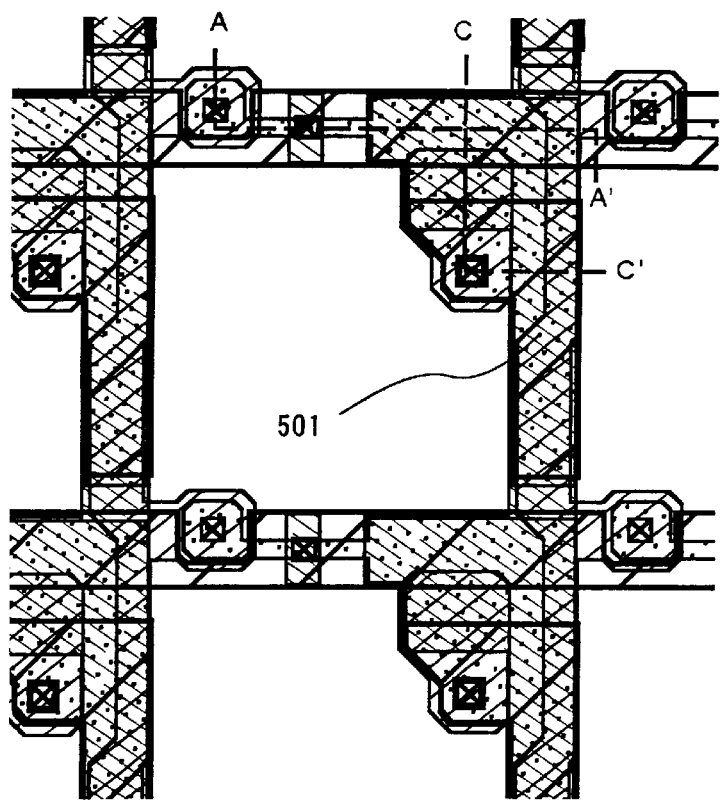
FIGS. 5A and 5B are a top view and a cross-sectional view, respectively, of a pixel (Embodiment 2)
Figure 5B:
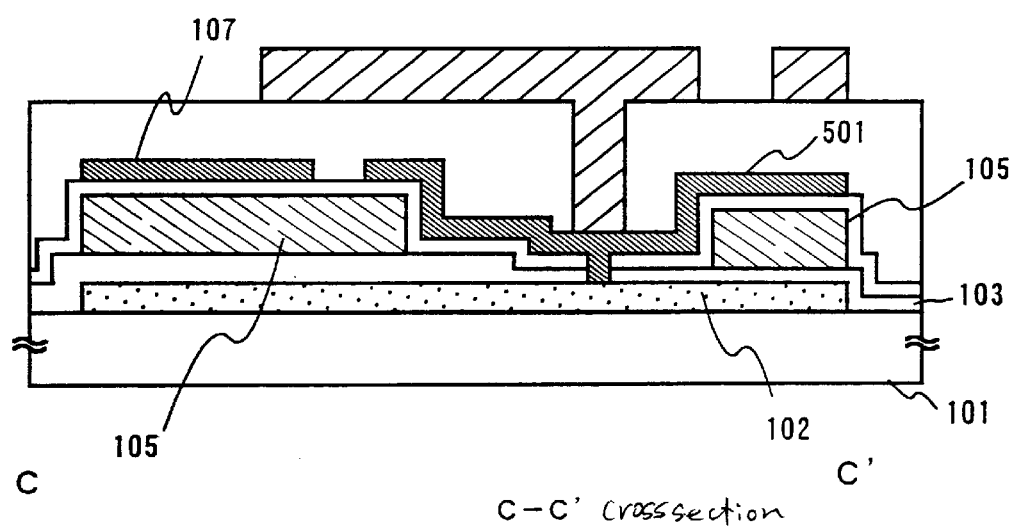

In Embodiment 2, an island shape electrode (a second electrode) is additionally formed with a wiring separated from the scanning line on the respective pixels at the same time in the formation process of the scanning line on the first insulating film in the structure of the above-stated Embodiment 1. FIG. 5A shows a top view of a pixel according to Embodiment 2, and the cross-sectional view taken along the dotted line C—C' in FIG. 5A is shown in FIG. 5B. Note that Embodiment 2 is different from Embodiment 1 only in forming the second electrode or not, and therefore the same reference numerals are used to designate the same components.

As shown in FIGS. 5A and 5B, a second electrode 501 is electrically connected to a source region formed in an island shape Si film 102 through a contact hole opened in the first insulating film. Furthermore, the second electrode 501 is arranged so that it overlaps a capacitor wiring.

By forming such a structure, a second storage capacitor can be formed with the second electrode 501 as the upper electrode, the first insulating film as a dielectric, and the capacitor wiring as the lower electrode, thereby forming the second storage capacitor. Thus, the holding characteristic of the image signal can be improved. In addition, the progress of making display devices smaller can be attained.

Further, a region where the second electrode 501, formed according to Embodiment 2, and the capacitor wiring overlap, overlaps a region of the first capacitor electrode region on the flat surface. Since the contact hole region reaching the island shape Si film can be arranged so that on the flat surface it overlaps the contact hole region that connects a pixel electrode line to the source region, there is no reduction in the aperture ratio.

With such a structure, similar to Embodiment 1, an area of 226.8 $\mu m^2$ of the pixel opening portion (aperture ratio of 61.5%) and an area of 83.4 $\mu m^2$ of the first storage capacitor are obtained with an additional area of 45.0 $\mu m^2$ of the second storage capacitor in Embodiment 2.

Embodiment 3

The structure of the active matrix liquid crystal display device shown in Embodiment 1 will be described here in Embodiment 3 with reference to the perspective view of FIG. 6. Note that the same reference numerals designate components corresponding to those in Embodiment 1.

Figure 6:
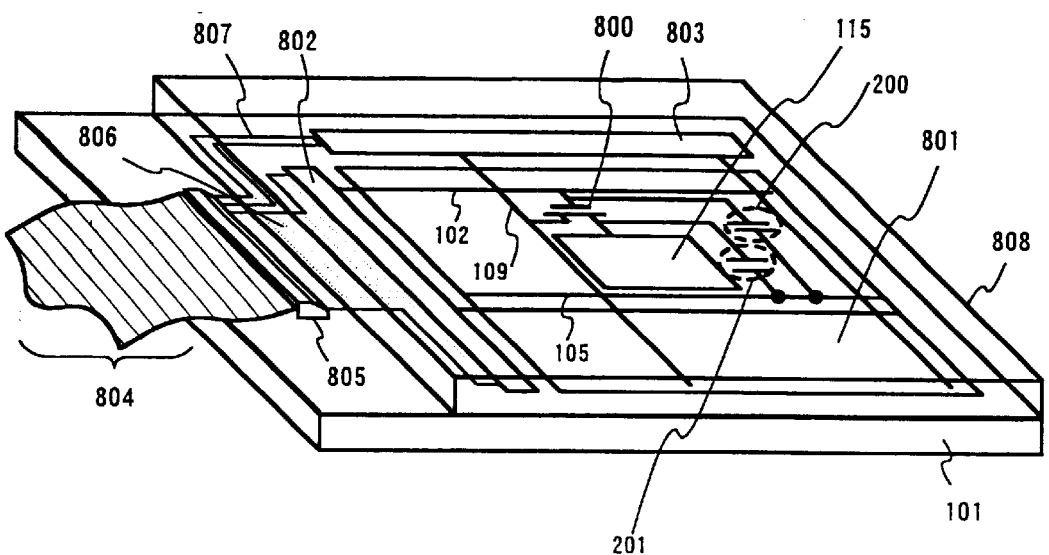
FIG. 6 is a view showing the outer appearance of an AM-LCD.

In FIG. 6, a matrix substrate is composed of a pixel portion 801, a scanning line driver circuit 802, a signal line driver circuit 803, and other signal processing circuits formed on a substrate 101. A pixel TFT 800, a first storage capacitor 200, and a second storage capacitor 201, which are connected to the pixel electrode 115, are provided in the pixel portion, and the driver circuits provided in the periphery thereof are structured based on a CMOS circuit.

Further, the capacitor wiring is provided in a direction parallel with the signal line and functions as the upper electrode of the first storage capacitor 200 or as the lower electrode of the second storage capacitor 201. The capacitor wiring is also grounded or connected to a fixed electric potential.

The scanning line 102 and the signal line 109, from the scanning line driver circuit 802 and the signal line driver circuit 803, respectively, extend to the pixel portion and are connected to the pixel TFT 800. Further, an FPC (Flexible Printed Circuit) 804 is connected to an external input terminal 805 to be utilized for inputting signals such as image signals. The FPC 804 is firmly fixed with a reinforced resin. Then connecting wirings 806 and 807 are connected to the respective driver circuits. Though not shown in the drawing, a light shielding film and a transparent electrode are provided on an opposing substrate 808.

Further, the structure of Embodiment 3 can be combined with that of Embodiment 2.

Embodiment 4

The CMOS circuit and the pixel matrix circuit formed by implementing the present invention can be used in various electro-optical devices (active matrix type liquid crystal display device, active matrix EL display, and active matrix EC display). That is, the present invention can be implemented in all electronic equipment that incorporate these electro-optical devices as a display portion.

The following can be given as such electronic equipment: a video camera, a digital camera, a projector (a rear type or a front type), a head mount display (goggle type display), a car navigation system, a personal computer, a portable information terminal (such as a mobile computer, a cellular phone, and an electronic book) etc. Some examples of these are shown in FIGS. 7A to 7F and FIGS. 8A to 8D.

Figure 7A:
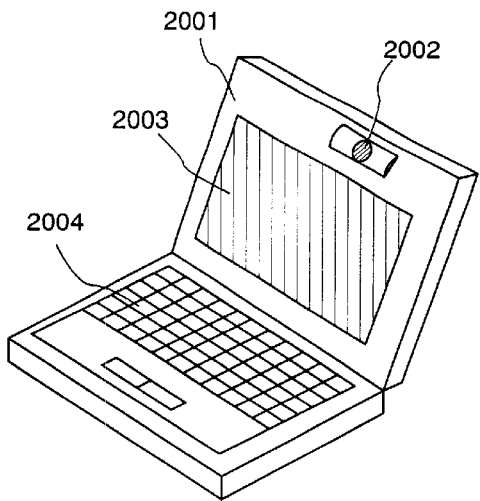
FIGS. 7A to 7F are diagrams showing examples of electronic equipment.

FIG. 7A shows a personal computer that is comprised of a main body 2001, an image input portion 2002, a display portion 2003, and a keyboard 2004. The present invention can be applied to the display portion 2003.

Figure 7B:
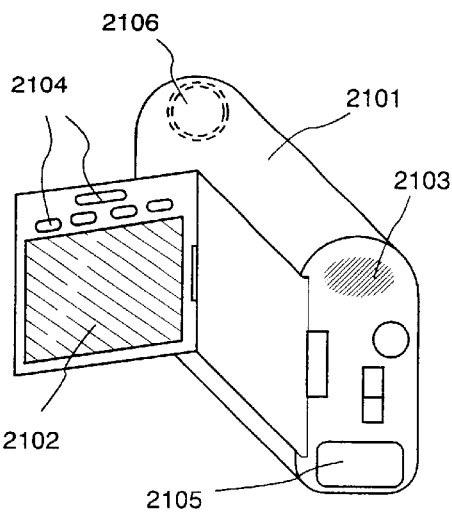

FIG. 7B shows a video camera that is comprised of a main body 2101, a display portion 2102, an audio input portion 2103, operation switches 2104, a battery 2105, and an image receiving portion 2106. The present invention can be applied to the display portion 2102.

Figure 7C:
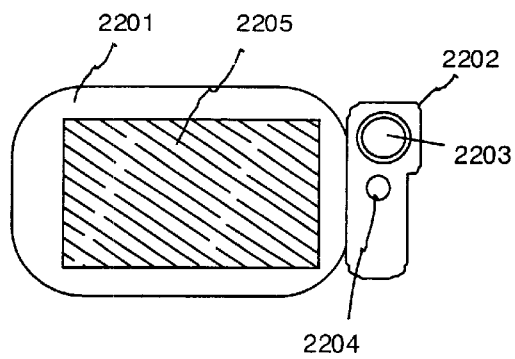

FIG. 7C shows a mobile computer that is composed of a main body 2201, a camera portion 2202, an image receiving portion 2203, operation switches 2204, and a display portion 2205. The present invention can be applied to the display portion 2205.

Figure 7D:
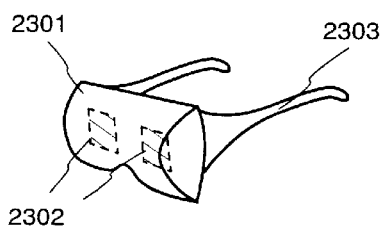

FIG. 7D shows a goggle type display that is comprised of a main body 2301, display portions 2302, and arm portions 2303. The present invention can be applied to the display portion 2302.

Figure 7E:
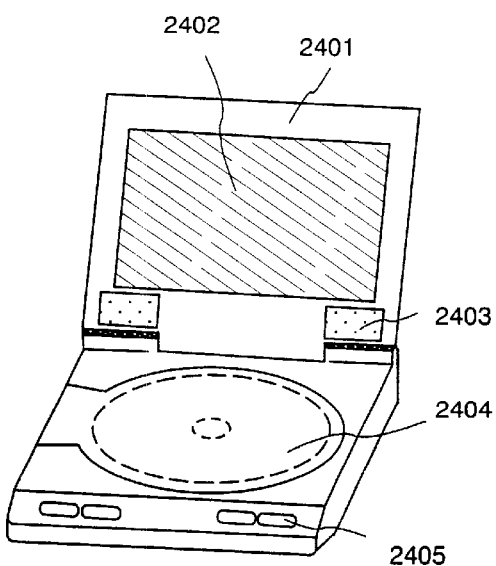

FIG. 7E shows a player which uses a recording medium in which a program is stored (hereinafter referred to as a recording medium) and which is comprised of a main body 2401, a display portion 2402, speaker portions 2403, a recording medium 2404, and operation switches 2405. A DVD (Digital Versatile Disc), a compact disc (CD) or the like is used as the recording medium to enable the player to appreciate music and the movies, and play a video game or the Internet. The present invention can be applied to the display portion 2402.

Figure 7F:
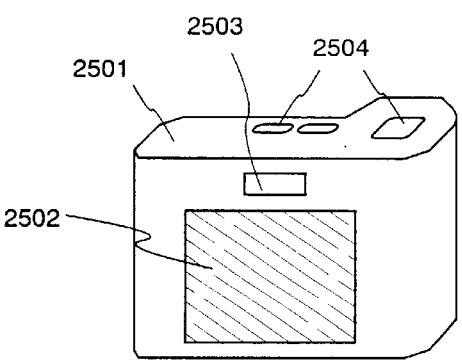
Figure 9:
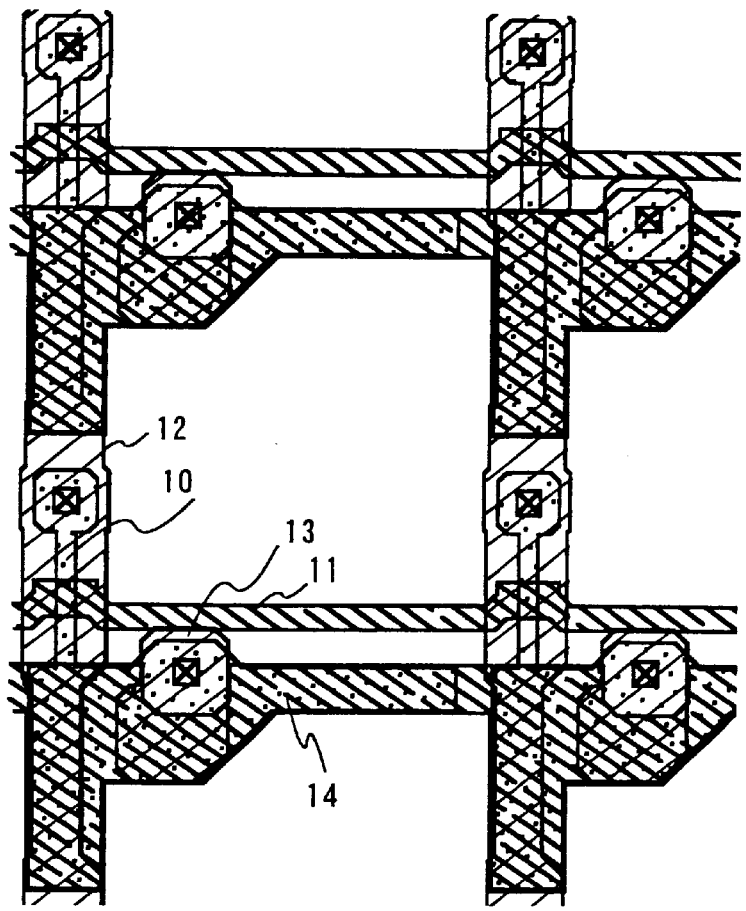
FIG. 9 is a top view of a conventional pixel.
Figure 9:
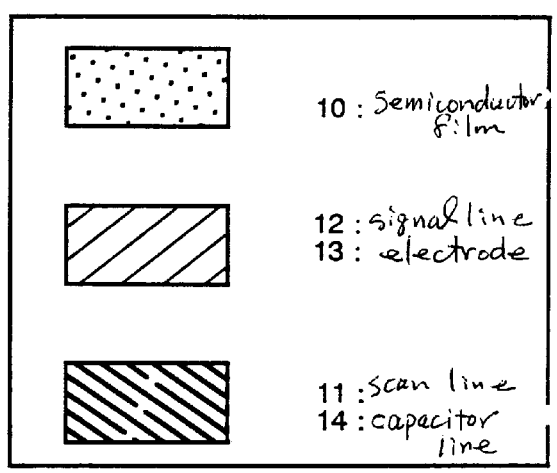

FIG. 7F shows a digital camera that is comprised of a main body 2501, a display portion 2502, an eye-piece portion 2503, operation switches 2504, and an image receiving portion (not shown in the figure). The present invention can be applied to the display portion 2502.

FIG. 8A shows a front type projector that is comprised of a projection unit 2601, a screen 2602, and the like. The present invention can be applied to a liquid crystal display device which is a part structuring the projection unit.

FIG. 8B shows a rear type projector that is comprised of a main body 2701, a projection unit 2702, a mirror 2703, a screen 2704, and the like. The present invention can be applied to the liquid crystal display device which is a part structuring the projection unit.

Illustrated in FIG. 8C is an example of the structure of the projection units 2601 and 2702 that are shown in FIGS. 8A and 8B, respectively. Each of the projection units 2601 and 2702 is comprised of a light source optical system 2801, mirrors 2802 and 2804 to 2806, dichroic mirrors 2803, a prism 2807, liquid crystal display devices 2808, phase difference plates 2809, and a projection optical system 2810. The projection optical system 2810 is constructed of an optical system including projection lenses. An example of a three plate system is shown in Embodiment 4, but there are no special limitations. For instance, an optical system of single plate system is acceptable. Further, the operator may suitably set optical systems such as optical lenses, polarizing film, film to regulate the phase difference, IR film, within the optical path shown by the arrows in FIG. 8C.

In addition, FIG. 8D shows an example of the structure of the light source optical system 2801 of FIG. 8C. In this embodiment, the light source optical system 2801 is composed of a reflector 2811, a light source 2812, 2813 and 2814, a polarizing conversion element 2815, and a condenser lens 2816. Note that the light source optical system shown in FIG. 8D is an example, and it is not limited to the illustrated structure. For example, the operator may suitably set optical systems such as optical lenses', polarizing film, film to regulate the phase difference, and IR film.

Thus, the application range for the present invention is extremely wide, and it may be applied to electronic equipment in all fields. Further, the electronic equipment of this Embodiment can be realized with a composition that uses any combination of Embodiments 1 to 3.

As described above, the application range of the present invention is extremely wide, and it may be applied to electronic equipment in all fields. Further, the electronic equipment of Embodiment 4 can be realized with a composition that uses any combination of Embodiments 1 to 3.

Figure 10:
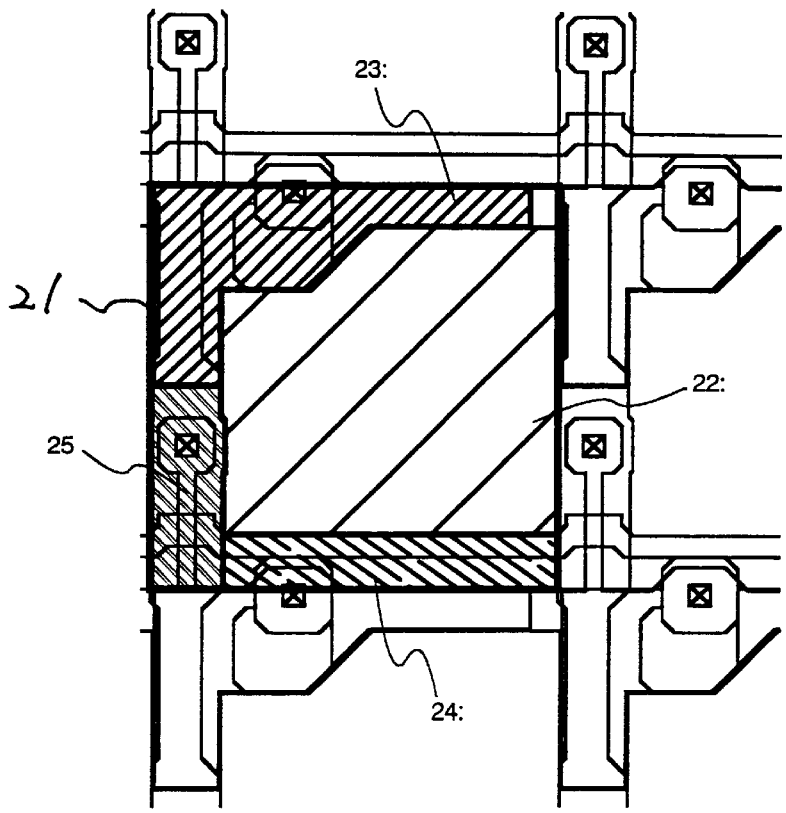
FIG. 10 is a view showing a conventional pixel opening region.
Figure 10:
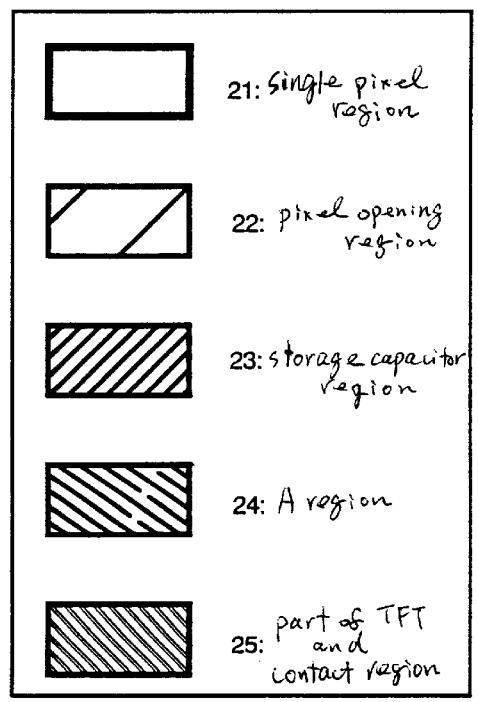

According to the present invention, a region (the region that corresponds to the A region in FIG. 10) that was conventionally used as a wiring region within the scanning line and the scanning line/capacitor wiring segregation region can be used as the storage capacitor. Further, with the structure of the plurality of pixels connected to the respective scanning lines such that they are connected to the individually independent capacitor wiring, when signal writing-in is performed continuously or simultaneously to each pixel and the neighboring pixel, each pixel does not receive the influence of the writing-in electric current of the neighboring pixel. In addition, the electric load of the respective capacitor wirings is dispersed in a timely manner, thereby reducing the effective load. Thus, the demand for the capacitor wiring resistance is alleviated.

Consequently, according to the liquid crystal display device employing the present invention, a liquid crystal display element having both a high aperture ratio and respective pixels, having therein storage capacitors which hold sufficient display signal electric potential, is obtained. Accordingly, satisfactory image display can be obtained while attaining small-scale and power-saving devices.

What is claimed is:

1. A semiconductor device comprising:
   a semiconductor film formed on an insulating surface;
   a first insulating film formed on the semiconductor film;
   a gate electrode and a first wiring formed on the first insulating film;
   a second insulating film formed on the gate electrode and the first wiring;
   a second wiring connected to the gate electrode, formed on the second insulating film; and
   a third insulating film formed on the second wiring,
   wherein the first wiring and the second wiring overlap via the second insulating film therebetween.

2. A semiconductor device comprising:
   a semiconductor film formed on an insulating surface;
   a first insulating film formed on the semiconductor film;
   a gate electrode and a first wiring formed on the first insulating film;
   a second insulating film formed on the gate electrode and the first wiring;
   a second wiring connected to the gate electrode, formed on the second insulating film; and
   a third insulating film formed on the second wiring,
   wherein the first wiring and the semiconductor film overlap via the first insulating film therebetween.

3. The semiconductor device according to claim 2 wherein a storage capacitor is formed in an overlapping portion of the first wiring and the semiconductor film with the first insulating interposed therebetween as a dielectric film of the capacitor.

4. The semiconductor device according to claim 2 wherein the first wiring and the second wiring overlap with said second insulating film interposed therebetween.

5. The semiconductor device according to claim 1 or 4 wherein a storage capacitor is formed in an overlapping portion between the first wiring and the second wiring with the second insulating film interposed as a dielectric layer of the capacitor.

6. The semiconductor device according to claim 2 wherein a portion of the semiconductor film overlapped with said first wiring is doped with an impurity for giving a conductivity type thereto.

7. The semiconductor device according to claim 1 or 2 wherein said first wiring extends in an orthogonal direction to said second wiring.

8. The semiconductor device according to claim 1 or 2 further comprising a third wiring connected to said semiconductor film, formed on said third insulating film.

9. The semiconductor device according to claim 8 wherein said third wiring is in contact with source or drain region of said semiconductor film.

10. The semiconductor device according to claim 1 or 2 further comprising a pixel electrode electrically connected to said semiconductor film.

11. The semiconductor device according to claim 1 or 2 wherein said first wiring extends in a direction parallel with said third wiring.

12. The semiconductor device according to claim 1 or 2 wherein said first wiring is a capacitor wiring.

13. The semiconductor device according to claim 1 or 2 wherein said second wiring is a scanning line.

14. The semiconductor device according to claim 1 or 2 wherein said third wiring is a signal line.

15. The semiconductor device according to claim 1 or 2 wherein said first insulating film is a gate insulating film.

16. The semiconductor device according to claim 1 or 2 wherein said semiconductor device is an active matrix liquid crystal display device.

17. The semiconductor device according to claim 1 or 2 wherein said semiconductor film is patterned in an island form.

18. The semiconductor device according to claim 1 or 2 wherein said semiconductor device is an active matrix type electro-luminescence display device.

19. An electronic device having the semiconductor device according to claim 1 or 2 wherein said electronic device is selected from the group consisting of a video camera, a digital camera, projector, a head mount display, a car navigation system, a personal computer, and a portable information terminal.

20. A semiconductor device comprising:

a plurality of scanning lines formed over a substrate;

a plurality of signal lines formed over said substrate, extending in an orthogonal relation to said plurality of scanning lines;

a plurality of thin film transistors disposed at intersections of said scanning lines and said signal lines, each of said thin film transistors comprising a semiconductor layer having a channel forming region and a gate electrode formed over the channel forming region with a gate insulating film interposed therebetween;

a plurality of capacitor lines formed over said semiconductor layer with said gate insulating film interposed therebetween;

a first interlayer insulating film formed over said plurality of thin film transistors and said capacitor lines wherein said scanning lines are formed on said first interlayer insulating film and electrically connected to said thin film transistors through contact holes of said first interlayer insulating film;

a second interlayer insulating film formed over said scanning lines; and a plurality of pixel electrodes formed over said second interlayer insulating film, wherein said scanning lines overlap said capacitor lines with said first interlayer insulating film interposed therebetween to form a plurality of storage capacitors therebetween.

21. A semiconductor device comprising:

a plurality of scanning lines formed over a substrate;

a plurality of signal lines formed over said substrate, extending in an orthogonal relation to said plurality of scanning lines;

a plurality of thin film transistors disposed at intersections of said scanning lines and said signal lines, each of said thin film transistors comprising a semiconductor layer having a channel forming region and a gate electrode formed over the channel forming region with a gate insulating film interposed therebetween;

a plurality of capacitor lines formed over said semiconductor layer with said gate insulating film interposed therebetween; and a plurality of pixel electrodes formed over said substrate and operationally connected to said plurality of thin film transistors, wherein said capacitor lines extend in a direction parallel with said signal lines.

22. The semiconductor device according to claim 20 or 21 wherein said semiconductor device is an active matrix type electro-luminescence display device.

23. The semiconductor device according to claim 20 or 21 wherein said semiconductor device is an active matrix type liquid crystal display device.

24. An electronic device having the semiconductor device according to claim 20 or 21 wherein said electronic device is selected from the group consisting of a video camera, a digital camera, projector, a head mount display, a car navigation system, a personal computer, and a portable information terminal.

* * * * *